(12) United States Patent
Wu et al.

(10) Patent No.: US 6,200,861 B1
(45) Date of Patent: Mar. 13, 2001

(54) METHOD OF FABRICATING HIGH DENSITY MULTIPLE STATES MASK ROM CELLS

(75) Inventors: Shye-Lin Wu, Hsinchu Hsien; Ling Chen, Hsinchu, both of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/276,646

(22) Filed: Mar. 26, 1999

(51) Int. Cl.⁷ .................................................. H01L 21/8236
(52) U.S. Cl. ................................................. 438/278; 438/275
(58) Field of Search ......................................... 438/275, 276, 438/277, 278

(56) References Cited

U.S. PATENT DOCUMENTS

| | | | |
|---|---|---|---|
| 5,585,297 | * 12/1996 | Sheng et al. | 438/278 |
| 5,683,925 | * 11/1997 | Irani et al. | 438/278 |
| 5,773,336 | * 6/1998 | Gu | 438/199 |
| 5,846,864 | * 12/1998 | Hsu | 438/276 |

* cited by examiner

Primary Examiner—Charles Bowers
Assistant Examiner—Jack Chen
(74) Attorney, Agent, or Firm—Rosenberg, Klein & Lee

(57) ABSTRACT

A method of fabricating high density multiple states mask ROM cells on a semiconductor substrate is disclosed. The method comprises the following steps. Firstly, the array of buried bit line is formed on semiconductor substrate. Then, a CVD oxide film is deposited on said substrate. The first coding mask is applied to dip out the CVD oxide film on the uncoded regions. Then, a thin gate oxide film is thermally grown on said substrate. At the same time, the CVD oxide film is densified and the N+source/drain junction of buried bit lines is formed. A conductive layer is then deposited on all area followed by defining the word lines. The second coding process is performed by using a high energy boron ion implantation through the conductive layer and gate oxide film into said predetermined regions. By combination of the first CVD oxide coding process and the second boron ion implantation coding process, a high density mask ROM with a multiple states is fabricated.

22 Claims, 4 Drawing Sheets

METHOD OF FABRICATING HIGH DENSITY MULTIPLE STATES MASK ROM CELLS

BACKGROUND OF THE INVENTION (1) Field of the Invention

The present invention relates to a mask ROM (read only memory), and more particularly, to a method of fabricating high density multiple states mask ROM cells.

(2) Description of the Prior Art

Read-only-Memory (ROM) circuits are used to permanently store code in electronic equipment, such as computers, microprocessor systems and the likes. The code or information stored in the ROM circuit is non-volatile when the power supply is powered off.

Memory cells are fabricated on a portion of the ROM device consisting of an array of single transistor, typically field effect transistor (FET), arranged in rows and columns. The arrays of FETs are built by first forming an array of closely spaced parallel electrically conducting line regions in the semiconductor substrate called "bit lines". The bit lines serve as the source/drain regions of the FETs, and also serve as the electrical interconnections to the peripheral circuits for outputting the stored binary data. The buried bit lines are usually formed in the semiconductor substrate by ion implantation and a thermal oxide is then grown on the semiconductor substrate forming the gate oxide of the FET between the bit lines. The thermal oxide also provides the electrical insulation layer over the bit lines. A plurality of closely spaced parallel conducting line called "word lines", usually formed from a doped polysilicon layer, are then formed on the semiconductor substrate having an orthogonal direction to the buried bit lines. The word lines serve as the gate electrode of the FETs and also function as the electrical interconnection to the peripheral address decode circuit. The array of ROM cells are then coded with information, such as micro-instruction, by permanently rendering selected transistor non-conducting during processing while non-coded cells can be switch on, when accessed by way of the address decode circuits. The coded information represented by a change or no change in the voltage level at the output circuit are used to represent the binary 1's and 0's. The code for the ROM is introduced during device processing by using a ROM code mask during one of the processing steps.

In a conventional mask ROM device, there are only two states, which are the "ON" state and the "OFF" state. The "OFF" state is typically defined by code implantation to increase the cell threshold voltage (Vth) is above 5 Volt, while the "ON" state is defined the cell Vth to be below 1 Volt. In a high density mask ROM (32 M or 64 M), a conventional two state mask ROM will consume a large wafer area due to the large chip size. If one memory cell can store more than three kinds of data, called a multiple states mask ROM, it is possible to greatly increase the storage capacity of a mask ROM. For example, if one memory cell can store four kinds of data, it is possible double the storage capacity in one chip without increasing the chip area.

A traditional method to fabricate a multiple states mask ROM cell, in the manner that changes the threshold voltage of memory cell transistors is given in U.S. Pat. No. 5,585,297 issued on Dec. 17, 1996. A plurality of ion implantation stages using boron ions is performed incorporating with using a plurality of different mask patterns and different dosage level. However, the high dose boron coding implantation will result in a lower junction breakdown performance of the coded FET and a very high band-to-band leakage current between the adjacent cells as stated in U.S. Pat. No. 5,683,925, issued on Nov. 4, 1997.

An alternative method is proposed in U.S. Pat. No. 5,556,800 issued on Sep. 17, 1996. In this method, the channel region of cell transistor is divided into dual parts; one divided part having a different gate oxide thickness to the other, and thus a different transitivity for implanted ions. Namely, the gate electrode has different characteristics of a drain current corresponding to a given gate voltage in the channel regions adjacent to each other. However, it is difficult to control the uniformity of device performance, due to the misalignment of photo mask.

Another method to form a tri-state mask ROM cell is proposed in U.S. Pat. No. 5,693,551 issued on Dec. 2, 1997. This invention makes use of a liquid-phase deposition process to form insulating blocks filling trenches among the word lines. After removing the shielding layer (photoresist) to reveal sidewalls, silicon nitride spacers are formed on the sidewalls. Some of the silicon nitride spacers are selectively removed to form different channel length of the word lines. The coding implantation is performed through polysilicon and gate oxide into semiconductor substrate to form a tri-state ROM cell. This method could prevent the occurrence of the misalignment, however, it is not compatible to use the liquid-phase deposition method in the modern integrated circuits fabrication.

The multi-state mask ROM cells can also be formed by using a stacked CVD oxide architecture, as shown in U.S. Pat. No. 5,576,573 issued on Nov. 19, 1996. This invention uses a number of CVD oxide deposition, masking and etching steps to form a multi-state mask ROM cell. However, this method will increase the fabrication cost and cycle time due to the more processing steps as compared to the other method.

SUMMARY OF THE INVENTION

An object of the present invention is to provide a multi-state mask ROM cell having a higher junction breakdown performance of the coded transistor and a lower band-to-band leakage current between the adjacent cells in comparison with the conventional one by using a plurality of ion implantation stages. Furthermore, a mask ROM cell, according to the present invention, has a short turn-around-time (TAT) as compared to convention one by using a plurality of CVD (Chemical Vapor Deposition) oxide deposition, photo masking, and etching steps. Also, a mask ROM cell, according to the present invention, can avoid the occurrence of photo mask misalignment.

The present invention comprises the following steps. Firstly, a pad oxide film is grown on semiconductor substrate. Then the buried bit line regions are defined followed by a buried bit line N+ion implantation (typically, dopant is using phosphorus and/or arsenic ions and dosage is ranging from $1 \times 10^{15}$ to $2 \times 10^{16}$ cm$^{-2}$, and at the implant energy of about 10 to 150 KeV). After striping the photoresist, a CVD oxide film is deposited on semiconductor substrate. The first coding mask is applied to dip out the CVD oxide film on the uncoded regions in the buffer oxide etchant (BOE) or diluted hydrofluoric (HF) acid solution. After striping the photoresist, a thermal oxidation process is used to grow thin gate oxide film and simultaneously to densify the CVD oxide film. A conductive layer, such as N+doped polysilicon, WSix, TiSix, TiN, WN, Ti, W, etc., is then deposited on all area followed by defining the word line regions. Then, the second coding process is performed by using a high energy boron ion implantation through the conductor layer and thin gate oxide film into the semiconductor substrate. The implantation energy is ranging from 50 to 1000 KeV, and the dosage is ranging from $5 \times 10^{12}$ to $1 \times 10^{15}$ cm$^{-2}$. By combination of the first CVD oxide coding process and the second boron ion implantation coding process, it is possible to fabricate a high density multi-state mask ROM cell in a short TAT time.

BRIEF DESCRIPTION OF THE DRAWINGS

The foregoing aspects and many of the attendant advantages of this invention will become more readily appreciated as the same becomes better understood by reference to the following detailed description, when in conjunction with the accompanying drawings in which.

DETAILED DESCRIPTION OF THE PREFERRED EMBODIMENT

A high density multiple states mask ROM cell and a method for fabricating it are disclosed. The detailed processes are best illustrated by reference to the drawings, and are described as follows.

Figure 1:
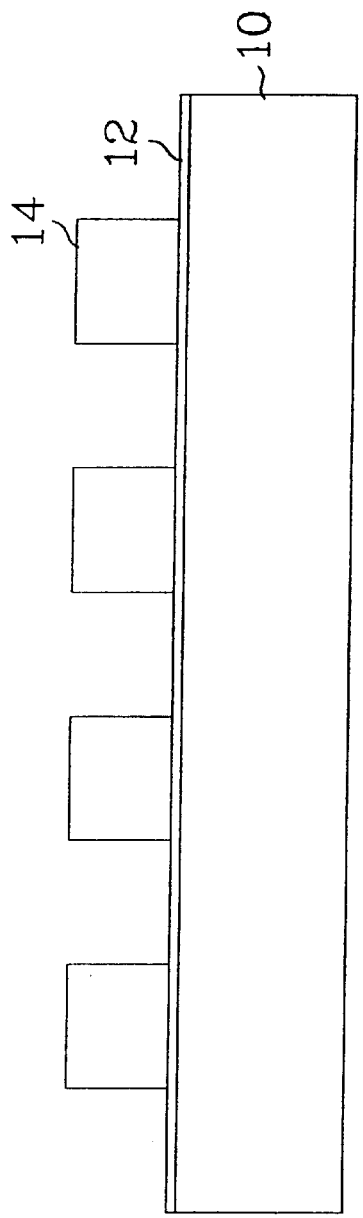
FIG. 1 is a cross-sectional view of patterning the buried bit line region on the semiconductor substrate, in accordance with the present invention.
Figure 2:
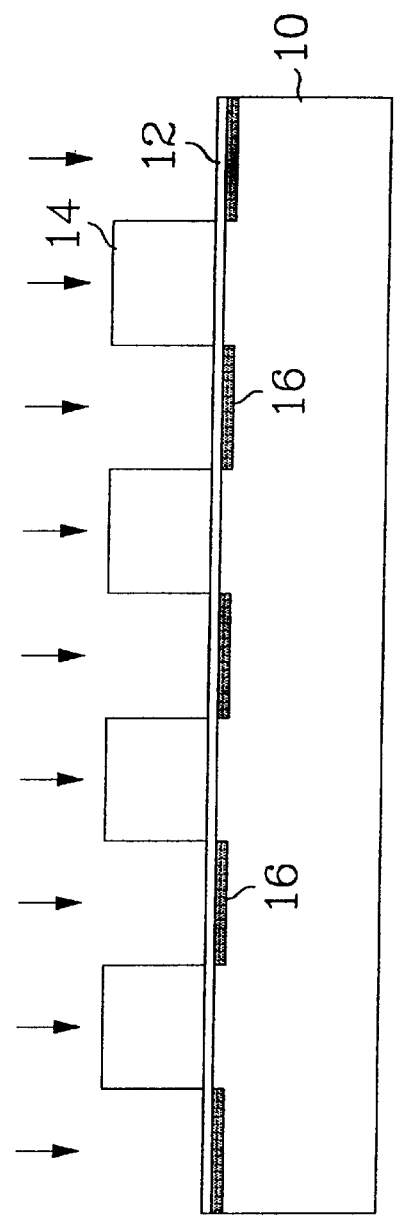
FIG. 2 is a cross-sectional view of a buried bit line N+implant through a thin pad oxide layer into the semiconductor substrate, in accordance with the present invention.

Referring to FIG. 1, a pad oxide layer 12 is formed using a CVD method or a thermal oxidation method on a semiconductor substrate 10. The thickness of the pad oxide layer 12 is about 3–50 nm. Then, the buried bit line regions are defined using patterning the photoresist 14. The photoresist 14 is used as a mask for buried bit line N+implantation 16, as shown in FIG. 2. Preferably, the dopant of the implantation can be used the arsenic or phosphorus ions and the dosage is ranged from $1 \times 10^{15}$ to $2 \times 10^{16}$ cm$^{-2}$.

Figure 3:
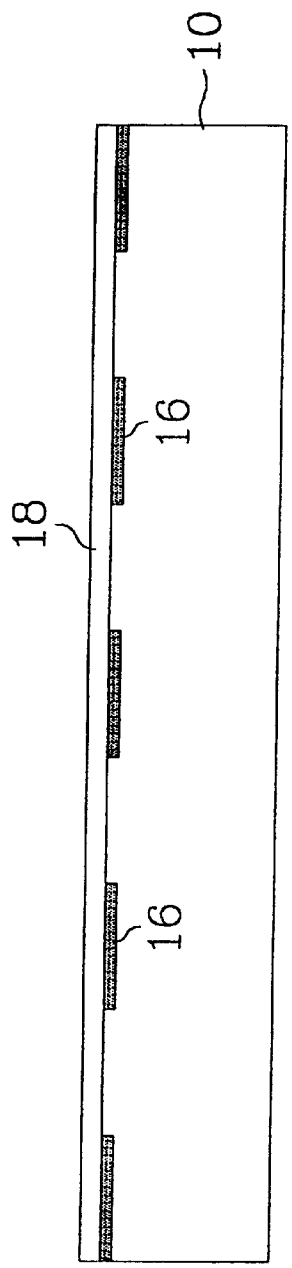
FIG. 3 is a cross-sectional view of a CVD oxide layer deposited on the semiconductor substrate, after stripping the photoresist and removing the thin pad oxide layer, in accordance with the present invention.

Referring to FIG. 3, a CVD oxide layer 18 is then deposited on the semiconductor substrate, after stripping the photoresist 14 and removing the pad oxide layer 12. The thickness of the CVD oxide layer 18 is about 15–100 nm. The CVD oxide layer 18 can be formed from the High Temperature Oxidation CVD (HTO-CVD) oxide, Low Pressure CVD (LP-CVD) oxide, Plasma Enhancement CVD (PE-CVD) oxide, Atomspherical Pressure CVD (AP-CVD) oxide, Electron Cyclotron Resonance CVD (ECR-CVD) oxide, and so on.

Figure 4:
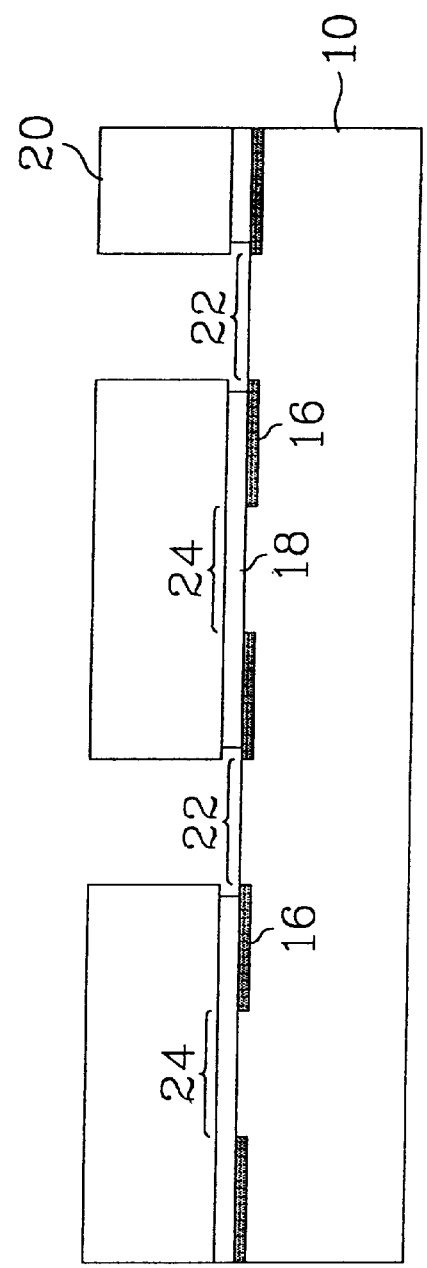
FIG. 4 is a cross-sectional view of patterning the first coding region, and then the CVD oxide layer on the uncoded regions are dipped out by diluted HF or BOE solution, in accordance with the present invention.

As shown in FIG. 4, a patterned photoresist 20 via conventional lithography technology is masked on the CVD oxide layer 18 for the first coding process. The CVD oxide layer 18 on the uncoded regions 22 are etched by diluted HF or BOE solution.

Figure 5:
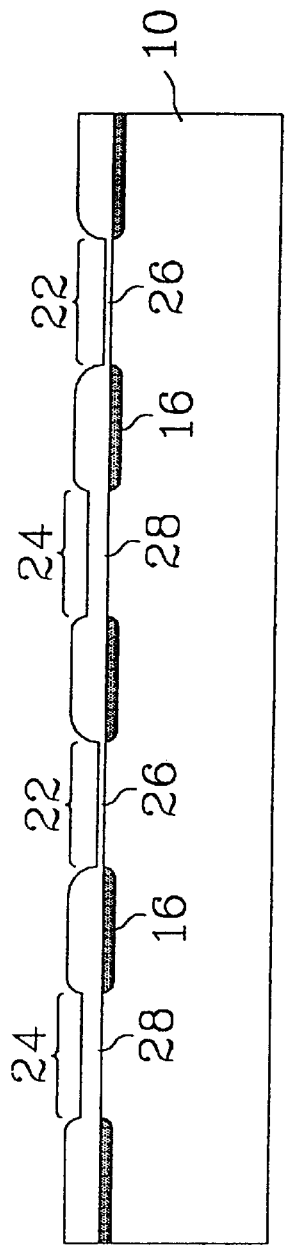
FIG. 5 is a cross-sectional view of forming a thin gate oxide on the semiconductor substrate by thermal oxidation process, in accordance with the present invention.

Referring to FIG. 5, after stripping the photoresist 20, a thin gate oxide film 26 is grown on the uncoded regions 22 using the thermal oxidation process. The thickness of the thin gate oxide film 26 is about 2–30 nm. The temperature of thermal oxidation process for growing the thin gate oxide film 26 is from 750° C. to 1150° C. and the oxidation ambient can be used the dry O2, N2/O2, steam, N2O or NO gas. At the same time, the CVD oxide layer 18 on the coded regions and the buried bit line regions 16 become more condensed and the effective oxide thickness is also larger than that of the thin gate oxide film 26. Therefore, two different gate oxide thickness can be formed on the different gate region. For example, the thickness of the gate oxide 26 grown at gate region 22 is thinner than the gate oxide 28 grown at gate region 24.

Figure 6:
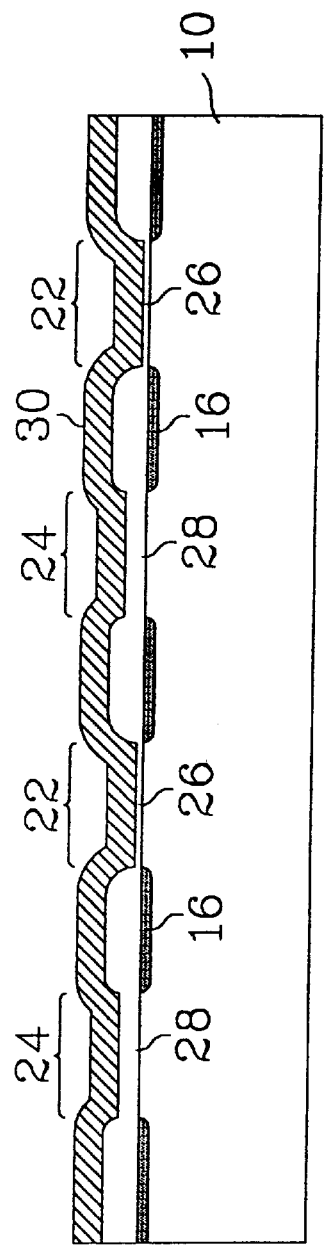
FIG. 6 is a cross-sectional view of depositing a conductor layer on all area followed by defining the word line regions, in accordance with the present invention.
Figure 7:
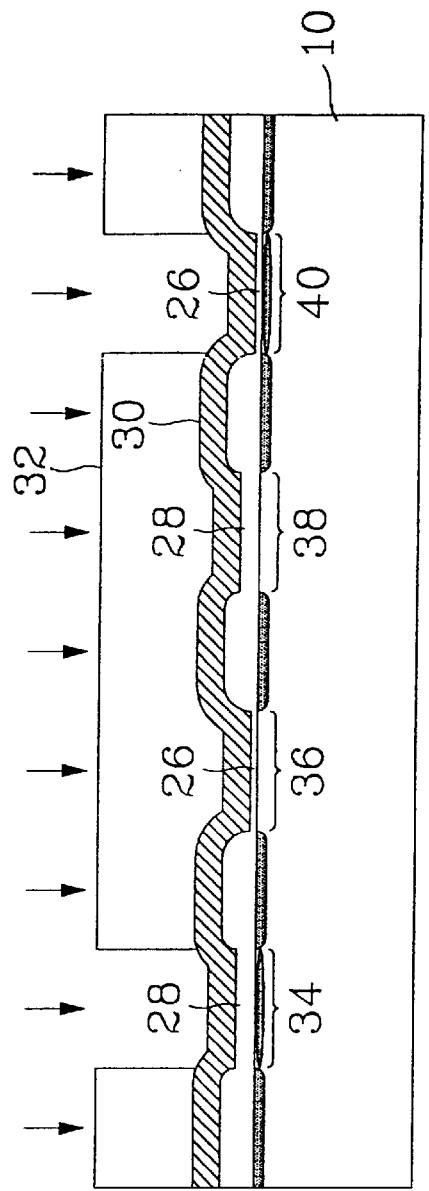
FIG. 7 is a cross-sectional view of patterning the second coding region and then a ROM code implant is performed through the conductor layer and the thin gate oxide film into the semiconductor substrate, in accordance with the present invention.

Referring to FIG. 6, a conductive layer 30, such as N+doped polysilicon, WSix, TiSix, TiN, WN, Ti, TaN, or W, etc., is deposited on all area followed by defining the word line region. Subsequently, as shown in FIG. 7, the photoresist 32 for the second coding process is patterned and then a ROM code implantation is performed through the conductor layer 30 and the gate oxide films of 26 and 28 into the semiconductor substrate to form the coded regions of 34 and 40. Therefore, by combination of these two coding processes, four different channel regions, such as 34, 36, 38, 40, can be obtained.

Figure 8:
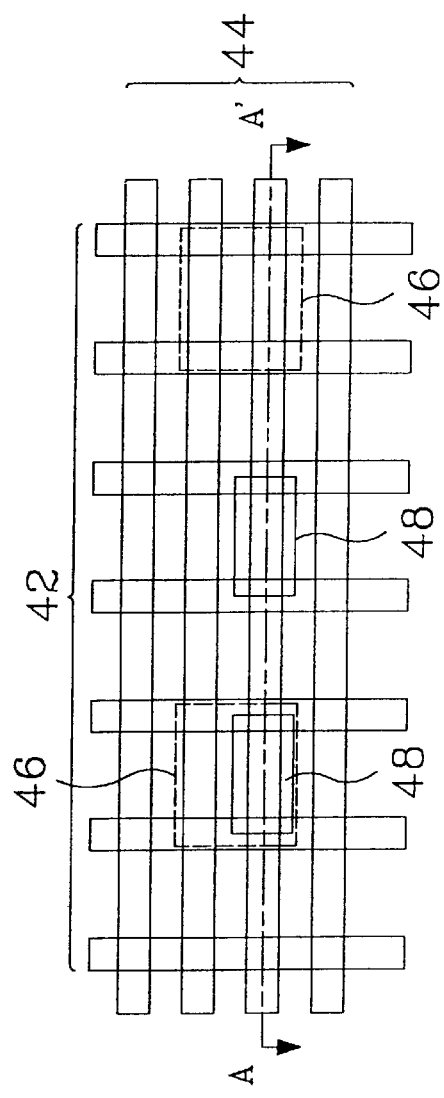
FIG. 8 is a top view of high density multiple states mask ROM device, in accordance with the present invention.

FIG. 8 is a mask ROM array scheme according to the present invention. The number of 42 shows the buried bit line regions and the number of 44 shows the word line regions. The number of 46 depicts the first coding region and the number of 48 depicts the second coding region. Along the AA' direction, as shown in FIG. 7 after the photoresist mask 32 has been stripped, it is seen that four types of threshold voltage can be obtained to form a four-state ROM device. Table 1 is an embodiment of the present invention. The channel regions 34, 36, 38, 40, is shown in FIG. 7.

TABLE 1

| Channel Region | Gate oxide thickness | ROM code implantation | Threshold voltage |
| --- | --- | --- | --- |
| 36 | 14 nm | NO | 0.69 V |
| 38 | 390 nm | NO | 1.67 V |
| 40 | 14 nm | B-150-2E14 | 3.05 V |
| 34 | 390 nm | B-150-2E14 | 7.69 V |

It is seen that the threshold voltage of mask ROM cells varies significantly with or without first and second coding process. The string "B-150-2E14" represents the ROM code implantation by using boron ions with a dosage of $2 \times 10^{14}$ cm$^{-2}$ and at the energy of 150 KeV. The channel regions 36 and 38 represent the different gate oxide thickness without ROM code implantation. The threshold voltage varies with the gate oxide thickness. The channel regions of 36 and 40, and, channel regions of 38 and 34 represent the same gate oxide thickness without and with ROM code implantation. The threshold voltage varies with the ROM code implantation. The channel regions of 40 and 34 represent the different gate oxide thickness with the same ROM code implantation. It is obvious that there exist four different threshold voltages in one mask ROM cell.

One benefit of the present invention is that the multiple states high density ROM cells can be easily achieved without the penalty of high band-to-band tunneling leakage caused by the high dose boron ion implantation, as shown in U.S. Pat. Nos. 5,683,925 and 5,585,297. The other benefit is that the proposed method is much more easy to control for manufacturing as compared to the prior arts of U.S. Pat. Nos. 5,556,800 and 5,576,573.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

What is claimed is:

1. A method of fabricating high density multiple states mask ROM cells on a semiconductor substrate, said method comprising the steps as follows:

forming a pad oxide film on said substrate;

coating a first photoresist and then patterning a plurality of buried bit lines on said substrate;

forming a buried bit line N+doping on said substrate;

stripping said first photoresist and removing said pad oxide film and then depositing a CVD oxide layer on said substrate;

coating a second photoresist and patterning a plurality of first coding regions and then etching said CVD oxide layer over uncoded regions;

stripping said second photoresist and then growing a thermal gate oxide film layer on said substrate;

depositing a conductive layer over said thermal gate oxide film layer;

coating a third photoresist and patterning a plurality of word lines over said thermal gate oxide film layer oriented orthogonally with respect to a direction of said plurality of buried bit lines; and forming a ROM code implantation through said conductive layer and said thermal gate oxide film layer into said substrate to form a plurality of second coding regions to establish one of a plurality of predetermined threshold voltages at said first and second coding regions on said substrate.

2. The method according to claim 1, wherein said pad oxide film is about 3 to 50 nm in thickness.

3. The method according to claim 1, wherein said buried bit line N+doping is performed by using arsenic ion implantation with a dosage ranging from $1\times10^{15}$ to $2\times10^{16}$ cm$^{-2}$ and at an implant energy of about 10 to 150 KeV.

4. The method according to claim 1, wherein said buried bit line N+doping is performed by using phosphorus ion implantation with a dosage ranging from $1\times10^{15}$ to $2\times10^{16}$ cm$^{-2}$ and at an implant energy of about 10 to 150 KeV.

5. The method according to claim 1, wherein said CVD oxide layer is about 15 to 100 nm in thickness.

6. The method according to claim 1, wherein said thermal gate oxide film layer is about 2 to 30 nm in thickness.

7. The method according to claim 1, wherein said conductive layer is N+doped polysilicon.

8. The method according to claim 1, wherein said conductive layer is a metal-silicide selected from the group consisting of WSix and TiSix.

9. The method according to claim 1, wherein said conduction layer is a metal-nitride selected from the group consisting of TiN, WN, and TaN.

10. The method according to claim 1, wherein said ROM code implantation is a boron ion implant with a dosage ranging from $5\times10^{12}$ to $1\times10^{15}$ cm$^{-2}$ and at an energy of about 50 to 1000 KeV.

11. The method according to claim 1, wherein said plurality of predetermined threshold voltages range between 0.69 and 7.69 volts.

12. A method of fabricating high density multiple states mask ROM cells on a semiconductor substrate, said method comprising the steps as follows:

forming a pad oxide film on said substrate;

coating a first photoresist and then patterning a plurality of buried bit lines on said substrate;

forming a buried bit line N+doping on said substrate;

stripping said first photoresist and removing said pad oxide film and then depositing a CVD oxide layer on said substrate;

coating a second photoresist and patterning a plurality of first coding regions and then etching said CVD oxide layer on uncoded regions;

stripping said second photoresist and then growing a thermal gate oxide film layer on said substrate;

depositing a conductive layer over said thermal gate oxide film layer;

coating a third photoresist and patterning a plurality of word lines over said thermal rate oxide film layer so that said plurality of word lines cross above said plurality of of buried bit lines; and forming a ROM code implantation through said conductive layer and said thermal gate oxide film layer into said substrate to form a plurality of second coding regions to establish one of a plurality of predetermined threshold voltages at said first and second coding regions on said substrate.

13. The method according to claim 12, wherein said pad oxide film is about 3 to 50 nm in thickness.

14. The method according to claim 12, wherein said buried bit line N+doping is performed by using arsenic ion implantation with a dosage ranging from $1\times10^{15}$ to $2\times10^{16}$ cm$^{-2}$ and at an implant energy of about 10 to 150 KeV.

15. The method according to claim 12, wherein said buried bit line N+doping is performed by using phosphorus ion implantation with a dosage ranging from $1\times10^{15}$ to $2\times10^{16}$ cm$^{-2}$ and at an implant energy of about 10 to 150 KeV.

16. The method according to claim 12, wherein said CVD oxide layer is about 15 to 100 nm in thickness.

17. The method according to claim 12, wherein said thermal gate oxide film layer is about 2 to 30 nm in thickness.

18. The method according to claim 12, wherein said conductive layer is N+doped polysilicon.

19. The method according to claim 12, wherein said conductive layer is a metal-silicide selected from the group consisting of WSix and TiSix.

20. The method according to claim 12, wherein said conductive layer is a metal-nitride selected from the group consisting of TiN, WN, and TaN.

21. The method according to claim 12, wherein said ROM code implantation is a boron ion implant with a dosage ranging from $5\times10^{12}$ to $1\times10^{15}$ cm$^{-2}$ and at an energy of about 50 to 1000 KeV.

22. The method according to claim 12, wherein said plurality of predetermined threshold voltages range between 0.69 and 7.69 volts.

* * * * *